US008023587B2

(12) United States Patent
Deng et al.

(10) Patent No.: US 8,023,587 B2
(45) Date of Patent: Sep. 20, 2011

(54) DEVICE AND METHOD FOR PRE-DISTORTING A BASE-BAND DIGITAL SIGNAL

(75) Inventors: Jiefeng Deng, Guangdong Province (CN); Erni Zhu, Guangdong Province (CN); Yong Du, Guangdong Province (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 719 days.

(21) Appl. No.: 11/945,168

(22) Filed: Nov. 26, 2007

(65) Prior Publication Data
US 2008/0095264 A1    Apr. 24, 2008

Related U.S. Application Data

(63) Continuation of application No. PCT/CN2006/001117, filed on May 26, 2006.

(30) Foreign Application Priority Data

May 27, 2005    (CN) .......................... 2005 1 0073002

(51) Int. Cl.
H04K 1/02        (2006.01)
(52) U.S. Cl. ........................................................ 375/296
(58) Field of Classification Search ................... 375/296
See application file for complete search history.

(56) References Cited

U.S. PATENT DOCUMENTS

| 5,867,065 | A | | 2/1999 | Leyendecker | |
|---|---|---|---|---|---|
| 5,923,712 | A | * | 7/1999 | Leyendecker et al. | ........ 375/297 |
| 6,356,146 | B1 | | 3/2002 | Wright et al. | |
| 6,373,888 | B1 | | 4/2002 | Lindoff | |
| 2002/0050372 | A1 | | 5/2002 | Lee | |
| 2005/0105642 | A1 | | 5/2005 | Muller et al. | .................. 375/296 |
| 2006/0198464 | A1 | * | 9/2006 | Sasaki et al. | .................. 375/296 |
| 2006/0240786 | A1 | | 10/2006 | Liu | |

FOREIGN PATENT DOCUMENTS

| CN | 1204188 A | 1/1999 |
|---|---|---|
| CN | 1299532 A | 6/2001 |
| CN | 1335699 A | 2/2002 |

(Continued)

OTHER PUBLICATIONS

Office action issued in corresponding Japanese patent application No. 2008-512677, dated Feb. 1, 2011, and English translation thereof, total 12 pages.

(Continued)

Primary Examiner — Kevin Kim

(57) ABSTRACT

A device and method for pre-distorting a base-band digital signal. The device includes an adaptive parameter calculation unit and a pre-distorter. The adaptive parameter calculation unit is adapted to calculate nonlinear filter parameters in accordance with samples of a base-band digital signal and a feedback signal of a radio frequency channel, and output a calculation result to the pre-distorter. The pre-distorter is adapted to store and update the nonlinear filter parameters, perform power statistics of the base-band digital signal, select nonlinear filter parameters corresponding to a result of the power statistics, pre-distort the base-band digital signal, and output the pre-distorted base-band digital signal. With the method, the non-linearity of a power amplifier may be improved, different non-linearity inverse models may be selected according to different input signals and power amplifier characteristics, and the efficiency of a base station transmitter may be improved.

21 Claims, 9 Drawing Sheets

FOREIGN PATENT DOCUMENTS

| | | |
|---|---|---|
| CN | 1336699 A | 2/2002 |
| CN | 1337793 A | 2/2002 |
| CN | 1341992 A | 2/2002 |
| CN | 1341992 A | 3/2002 |
| EP | 1318643 A1 | 6/2003 |
| EP | 1716635 A1 | 6/2005 |
| GB | 2337169 A | 11/1999 |
| JP | 1999500280 A | 1/1999 |
| JP | 2001251148 A | 9/2001 |
| JP | 2002232494 A | 8/2002 |
| JP | 2002527997 A1 | 8/2002 |
| JP | 2003188747 A | 7/2003 |
| JP | 2004007083 A | 1/2004 |
| JP | 2005033535 A | 2/2005 |
| JP | 2006505160 T | 2/2006 |
| WO | 9625789 A1 | 8/1996 |
| WO | 0022791 A1 | 4/2000 |
| WO | 01/05026 A1 | 1/2001 |
| WO | 2004019577 A1 | 3/2004 |
| WO | 2004070942 A1 | 8/2004 |
| WO | 2004/112240 | 12/2004 |

OTHER PUBLICATIONS

Decision of rejection of corresponding Japanese patent application No. 2008-512677, Mailed Jun. 7, 2011, and English translation thereof, total 4 pages.

* cited by examiner

Before switching    After switching

DEVICE AND METHOD FOR PRE-DISTORTING A BASE-BAND DIGITAL SIGNAL

CROSS REFERENCE TO RELATED APPLICATIONS

This application is a Continuation Application of PCT/CN2006/001117 submitted on May 26, 2006, claiming the priority from Chinese Patent application No. 200510073002.4 submitted on May 27, 2005, the contents of which are incorporated herein by reference.

FIELD OF THE PRESENT INVENTION

The present invention relates to signal processing systems in the field of modern communications, and in particular, to a device and method for pre-distorting a base-band digital signal.

BACKGROUND OF THE PRESENT INVENTION

The Global System for Mobile Communications (GSM), known as a Second Generation (2G) digital mobile cellular communication system, has been commonly applied worldwide. Due to the scarcity of frequency resources and the increasing demands for new services, the trend of development is turning to the Third Generation (3G) mobile communication system and the Beyond Third Generation (B3G) mobile communication system inevitably. In the existing 3G system and B3G system, a non-constant envelope digital modulation system is commonly used to obtain a sufficient signal bandwidth. The use of this modulation technology not only facilitates the acquisition of a high rate signal, but also brings about a stricter requirement upon the linearity of a base station transmitter including a power amplifier.

In the prior art, one solution to the linearity of a power amplifier in the 3G system or the like is a feed forward scheme. However, this scheme may be disadvantageous because the use of analogy technologies results in a high complexity in implementation of this scheme and a poor consistency in manufacturing procedures, as well as precise adjustment for various parameters of a feed-forward network required for a professional technician. Moreover, a large number of additional analogy radio frequency devices are needed in the implementation of the method, so the efficiency of the power amplifier can not be improved effectively.

In the prior art, another solution to the linearity of a power amplifier in the 3G system or the like is a method for pre-distorting a base-band digital signal. The essence of this method is to feed back a signal output from the power amplifier to the digital domain in a certain way, then to calculate the linearity characteristic of a radio frequency channel including the power amplifier by using an adaptive algorithm, and finally to preprocess the base-band digital signal by a pre-distorter before converting the signal from the digital domain into the analogy domain. The preprocessed signal passed through the power amplifier approximately presents no distortion compared with the base-band digital signal. As a result, a linear output from the power amplifier is achieved.

This pre-distortion method may be disadvantageous in that the nonlinear function of the pre-distorter can not be selected according to different applications. In other words, this method has to be designed according to specific applications, and hence can not be applied universally. As a result, the transmitter of a base station may have a relatively low efficiency as a whole.

SUMMARY OF THE PRESENT INVENTION

In view of the above, the present invention is to provide a device and method for pre-distorting a base-band digital signal, in which different nonlinear inverse models may be selected in accordance with different input signals and the characteristics of power amplifier, so that the whole efficiency of a base station transmitter may be improved.

The present invention provides the following technical solutions:

A device for pre-distorting a base-band digital signal, which may include an adaptive parameter calculation unit and a pre-distorter. The adaptive parameter calculation unit is adapted to calculate nonlinear filter parameters in accordance with samples of a base-band digital signal and samples of a feedback signal of a radio frequency channel, and output a calculation result to the pre-distorter. The pre-distorter is adapted to store and update the nonlinear filter parameters, perform power statistics of the base-band digital signal, select nonlinear filter parameters corresponding to a result of the power statistics, pre-distort the base-band digital signal by using the selected nonlinear filter parameters, and output the pre-distorted base-band digital signal.

Optionally, nonlinearity characteristic of the pre-distorter is reciprocal to nonlinearity characteristic of the radio frequency channel.

Optionally, the pre-distorter may include:
a nonlinear filter unit, including multi-stage coefficient-variable Finite Impulse Response filters, adapted to delay data stream of an input signal, do calculation with multi-stage input signals obtained by delaying the input signal and the selected nonlinear filter parameters, and form and output an output signal.

Optionally, the nonlinear filter may include a delay module, a multiplier module and an accumulator,
the delay module is adapted to delay data streams of I, Q components of the input signal, and send the delayed I, Q components of the input signal to a corresponding multiplier; the multiplier module is adapted to complex multiply the input signal in accordance with the delayed I, Q components of the input signal and the selected nonlinear filter parameters, and output the multiplied signal to the accumulator; and the accumulator is adapted to accumulate the signal output from the multiplier, and output the accumulated signal.

Optionally, in the multiplier, a relationship between the input signal and the output multiplied signal is expressed by $$O_i = I_i \times T_{ii} + Q_i \times T_{iq}$$

$$O_q = I_i \times T_{qi} + Q_i \times T_{qq}$$

where $I_i$ and $Q_i$ respectively denote the I, Q components of the input signal, $T_{ii}$, $T_{iq}$, $T_{qi}$ and $T_{qq}$ respectively denote four corresponding selected nonlinear filter parameters, $O_i$ and $O_q$ respectively denote I, Q components of the output multiplied signal.

Optionally, in the multiplier, a relationship between the input signal and the output multiplied signal is expressed by $$O_i = I_i \times T_i - Q_i \times T_q$$

$$O_q = I_i \times T_q + Q_i \times T_i$$

where $I_i$ and $Q_i$ respectively denote the I, Q components of the input signal, $T_i$ and $T_q$ respectively denote two corresponding nonlinear filter parameters, and $O_i$ and $O_q$ respectively denote I, Q components of the output multiplied signal.

Optionally, the pre-distorter may further include a signal instantaneous power acquiring module, a signal short-time average power acquiring module and a lookup table module:

the signal instantaneous power acquiring module is adapted to calculate instantaneous power of an input signal, and send a calculation result to the lookup table module; the signal short-time average power acquiring module is adapted to calculate short-time average power of an input signal, and send a calculation result to the lookup table module; and the lookup table is adapted to store and update the nonlinear filter parameters calculated by the adaptive parameter calculation unit, select nonlinear filter parameters in accordance with the calculation results received from the signal instantaneous power acquiring module and the signal short-time average power acquiring module as well as an order number of taps of the nonlinear filter unit, and output the selected nonlinear filter parameters to the nonlinear filter unit.

Optionally, the lookup table module may include:
a buffer memory for switching the nonlinear filter parameters, adapted to update the nonlinear filter parameters dynamically.

Optionally, the pre-distorter may further include:
a pre-power adjustment and delay unit, adapted to adjust power of the base-band digital signal, delay data stream of the adjusted signal, and send the delayed data stream to the nonlinear filter unit; a signal sampling and buffer module, adapted to sample the base-band digital signal and the feedback signal of an output signal of the radio frequency channel, and buffer and send the sampled signals to the adaptive parameter calculation unit; a post power adjustment unit, adapted to adjust power of an output signal of the pre-distorter, and send the adjusted output signal to a signal adjustment module; and a signal adjustment module, adapted to adjust phase of a signal output from the post power adjustment unit, and output the adjusted output signal.

Optionally, the signal adjustment module may include:
a direct-current bias correction unit, adapted to adjust direct-current bias of a digital signal, and send the corrected signal; or a Quadrature Modulation Compensation network, adapted to correct IQ gain, phase imbalance and direct-current bias of a digital signal, and output the corrected signal; or a digital modulator, adapted to modulate digital IQ signals onto a digital intermediate frequency, and output the modulated signals.

Optionally, the pre-distorter may further include:
an over power protection unit, adapted to detect average power of an output signal of the pre-distorter, and limit amplitude of an output signal with an average power greater than a threshold of the pre-distorter; and a power overshoot protection unit, adapted to detect instantaneous power of an output signal of the pre-distorter, switch off the output signal of the pre-distorter if a proportion of the instantaneous power of the output signal greater than the threshold is greater than a predefined proportion, and recover the output signal of the pre-distorter after the instantaneous power of the output signal becomes normal.

Optionally, the pre-distorter may further include:
a synchronization signal module, adapted to provide the pre-distorter with a synchronization signal of the base-band digital signal if an abnormity appears in the base-band digital signal, control the selection of nonlinear filter parameters in the lookup table module by using the synchronization signal, and control the pre-distorter to stop sampling the base-band digital signal and the feedback signal if an abnormity appears in the base-band digital signal.

Optionally, the synchronization signal provided by the synchronization signal module enters a low-level state prior to occurrence of a power abnormity of the base-band digital signal, and enters a high-level state after the base-band digital signal recovers from the power abnormity.

Optionally, the adaptive parameter calculation unit may include:
a demodulation module, adapted to demodulate a feedback digital intermediate-frequency signal so as to obtain feedback IQ signals; a delay and matching module, adapted to delay and match received base-band IQ signals and the feedback IQ signals; a frequency shift/phase shift correction module, adapted to correct frequency shift and phase shift between the delayed and matched base-band IQ signals and feedback IQ signals; an optimal signal selection module, adapted to select optimal data from the corrected base-band IQ signals and feedback IQ signals; and a nonlinear parameter resolution module, adapted to calculate nonlinear filter parameters in accordance with the optimal data by using a certain algorithm.

Optionally, the device may further include:
a signal conversion and modulation module, adapted to convert a pre-distorted digital signal into an analog signal, modulate and convert the analog signal to a radio frequency; a radio frequency channel, including a power amplifier, adapted to amplify power of the analog signal converted to the radio frequency, and output the amplified signal; and a signal feedback and sampling module, adapted to feed back and sample the signal output from the radio frequency channel, and send the sampled signal to the pre-distorter.

Another embodiment of the present invention provides a method for calculating nonlinear filter parameters, which may include:
demodulating a feedback digital signal; delaying and matching the demodulated feedback digital signal and a base-band digital signal; correcting frequency shift and phase shift of the delayed and matched feedback digital signal and base-band digital signal; selecting optimal data from the base-band digital signal and the feedback digital signal obtained by correcting the frequency shift and phase shift; and calculating nonlinear filter parameters in accordance with the selected optimal data.

Optionally, prior to the correcting frequency shift and phase shift of the delayed and matched feedback digital signal and base-band digital signal, the method may further include:
obtaining the frequency shift and phase shift between the base-band digital signal and the feedback digital signal by using a least square algorithm.

Optionally, the selecting optimal data from the base-band digital signal and the feedback digital signal obtained by correcting the frequency shift and phase shift may include:
selecting optimal data from the base-band digital signal and the feedback digital signal by using a peak sample selection method and/or a random sample selection method, wherein the peak sample selection method selects sufficient samples having one of maximum signal instantaneous amplitude, or maximum signal absolute value, or maximum signal amplitude variance; and the random sample selection method selects sufficient samples having distribution characteristic identical to amplitude distribution characteristic of a signal to be selected.

Another embodiment of the present invention provides a method for pre-distorting a base-band digital signal, which may include:

calculating nonlinear filter parameters in accordance with samples of an input base-band digital signal and samples of a feedback signal of a radio frequency channel; and performing power statistics of the input base-band digital signal, selecting nonlinear filter parameters corresponding to a result of the power statistics, pre-distorting the input base-band digital signal by using the selected nonlinear filter parameters, and outputting the pre-distorted base-band digital signal.

Optionally, the pre-distorting may include:

delaying data stream of the input base-band digital signal, performing calculation for multi-stage input signals obtained by the delaying and the selected nonlinear filter parameters, and forming and outputting an output signal.

Optionally, the pre-distorting may include:

delaying data streams of I, Q components of the input base-band digital signal; and complex multiplying the input base-band digital signal in accordance with the delayed IQ components of the input base-band digital signal and the selected nonlinear filter parameters, accumulating signals obtains from the complex multiplying, and outputting the accumulated signal.

Optionally, in the complex multiplying, a relationship between the input base-band digital signal and the output signal may be expressed by $$O_i = I_i \times T_{ii} + Q_i \times T_{iq}$$

$$O_q = I_i \times T_{qi} + Q_i \times T_{qq}$$

wherein $I_i$ and $Q_i$ respectively denote the I, Q components of the input base-band digital signal, $T_{ii}$, $T_{iq}$, $T_{qi}$ and $T_{qq}$ respectively denote four selected nonlinear filter parameters, $O_i$ and $O_q$ respectively denote I, Q components of the output signal.

Optionally, in the complex multiplying, a relationship between the input signal and the output signal may be expressed by $$O_i = I_i \times T_i - Q_i \times T_q$$

$$O_q = I_i \times T_q + Q_i \times T_i$$

wherein $I_i$ and $Q_q$ respectively denote I, Q components of the input base-band digital signal, $T_i$ and $T_q$ respectively denote two selected nonlinear filter parameters, and $O_i$ and $O_q$ respectively denote I, Q components of the output signal.

Optionally, the power statistics may include: calculating instantaneous power of the input base-band digital signal; and calculating short-time average power of the input base-band digital signal.

Optionally, selecting nonlinear filter parameters may include: selecting nonlinear filter parameters in accordance with calculation results received from a signal instantaneous power acquiring module and a signal short-time average power acquiring module as well as an order number of taps of a nonlinear filter unit.

Optionally, the method may further include: updating the nonlinear filter parameters redundantly and dynamically.

Optionally, in the method, a pre-distorter is provided with a synchronization signal of the base-band digital signal if an abnormity appears in the base-band digital signal, the selection of nonlinear filter parameters is controlled by using the synchronization signal, and the pre-distorter is controlled so as to stop sampling the base-band digital signal and the feedback signal if an abnormity appears in the base-band digital signal.

Optionally, calculating nonlinear filter parameters may include:

demodulating a feedback digital intermediate-frequency signal so as to obtain feedback IQ signals; delaying and matching base-band IQ signals and the feedback IQ signals; correcting frequency shift and phase shift between the delayed and matched base-band IQ signals and feedback IQ signals; selecting optimal data from the corrected base-band IQ signals and feedback IQ signals; and calculating the nonlinear filter parameters in accordance with the selected optimal data.

As can be seen from the above, the embodiments of the present invention provide a device for pre-distorting a base-band signal with the following advantages:

1. In the embodiments of the present invention, different nonlinear inverse models may be selected depending upon different input signals and power amplifier characteristics, so that the device may be applicable to all the wireless communication systems adopting the spread-frequency communication technologies or Orthogonal Frequency Division Multiplexing (OFDM) technologies, such as 2G, 3G, B3G or the like.

2. With the method according to the embodiments of the present invention, the quality of a transmitted signal may be improved, the efficiency of a power amplifier may be improved, and the cost and size of a base station may be reduced.

3. The pre-distorter according to the embodiments of the present invention may be implemented with an Application Specific Integrated Circuit (ASIC) or a Field Programmable Gate Array (FPGA), without a huge number of multipliers. Further, it is not necessary to calculate the accumulative sum of a signal and its higher-order frequency components in the pre-distorter. Therefore, it may be avoided to process data with a large dynamic range. As a result, the system cost may be further reduced.

Furthermore, in the embodiments of the present invention, a uniform lookup table is utilized, which improves the efficiency. Further, a synchronization mechanism for the base-band signal is adopted in the embodiments of the present invention. As a result, the output signal may be prevented from being deteriorated when the power of the base-band signal becomes abnormal.

BRIEF DESCRIPTIONS OF THE DRAWINGS

DETAILED DESCRIPTIONS OF THE EMBODIMENTS

The present invention provides a device for pre-distorting a base-band digital signal. The essence of the present invention lies in that filter coefficients in a pre-distorter may follow the change of the characteristics of a power amplifier. This may be implemented by use of a lookup table. Accordingly, good radio frequency characteristics of an output signal may be achieved.

Figure 1:
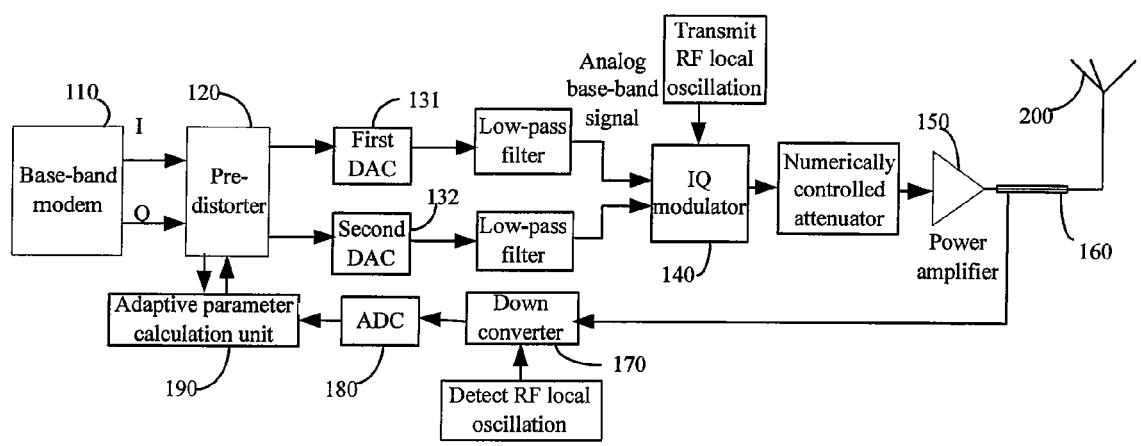
FIG. 1 is a structural diagram of a device according to an embodiment of the present invention.

The device according to the present invention will be detailed with reference to the drawings. FIG. 1 shows a device for pre-distorting a base-band digital signal according to the present invention which processes the base-band digital signal as follows:

Multi-carrier I, Q signals transmitted from a base-band modem 110 are pre-distorted by a pre-distorter 120, and the distorted multi-carrier I, Q signals are sent respectively to a first Digital-to-Analog Converter (DAC) 131 and a second Digital-to-Analog Converter (DAC) 132. The first and second DACs 131 and 132 convert the I, Q signals into analog zero intermediate-frequency I, Q signals respectively, and then an IQ modulator 140 performs an Analog Quadrature Modulation (AQM) to the analog zero intermediate-frequency I, Q signals, so that the signals are up converted into radio frequency. Then the signals are amplified, attenuated and impedance matched through a radio frequency channel, and then sent to a power amplifier 150 for power amplification.

A part of the signal output from the power amplifier 150 is transmitted by an antenna 200 via a duplexer, and the remaining part of the signal is fed back by a coupler 160 to a detection channel, converted by a down converter 170 into analog intermediate frequency, and sampled by a high speed Analog-to-Digital Converter (ADC) 180. The high speed Analog-to-Digital Converter (ADC) 180 outputs a digital intermediate feedback signal, which is then sent to the pre-distorter 120.

The digital intermediate-frequency feedback signal and the multi-carrier I, Q signals which are input into the pre-distortion system are sampled and buffered in the pre-distorter 120, and the buffered signals are sent to an adaptive parameter calculation unit 190 via an interface between the pre-distorter 120 and the adaptive parameter calculation unit 190.

The adaptive parameter calculation unit 190 calculates the filter parameters based upon the received signals by using an adaptive correction algorithm, and sends the calculated filter parameters to the pre-distorter 120. The calculated filter parameters are then stored in a lookup table module 124 (shown in FIG. 2) of the pre-distorter 120. The pre-distorter 120 selects the appropriate filter parameters depending upon the practical requirements to pre-distort the signals.

In an embodiment of the present invention, the pre-distorter 120 is typically implemented with a Field Programmable Gate Array (FPGA) or an Application Specific Integrated Circuit (ASIC) for the purpose of real-time correction of the base-band I, Q signals. Because the characteristics of the power amplifier changes slowly, and the updating of filter parameters may be enabled offline in a non-real-time manner, the adaptive parameter calculation unit 190 is typically implemented by using a Digital Signal Processor (DSP).

The core part of the device according to the embodiment of the present invention is the pre-distorter 120. The main characteristic of the pre-distorter 120 lies in that, its nonlinearity characteristic is reciprocal to that of the radio frequency channel including the power amplifier.

If the real part, the imaginary part and the instantaneous amplitude of a complex signal input into the pre-distorter 120 are denoted by $I_{in}(\bullet)$, $Q_{in}(\bullet)$ and $Mg_{in}(\bullet)$ respectively, the real and imaginary parts of a complex signal output from the pre-distorter 120 $I_{out}(\bullet)$ and $Q_{out}(\bullet)$ may be expressed by $$\begin{cases} I_{OUT}(k) = i_0 + \sum_{m=0}^{M-1} [a(m)f(Mg_{in}(k-m))I_{in}(k-m) + \\ \qquad\qquad b(m)f(Mg_{in}(k-m))Q_{in}(k-m)] \\ Q_{OUT}(k) = q_0 + \sum_{m=0}^{M-1} [c(m)f(Mg_{in}(k-m))I_{in}(k-m) + \\ \qquad\qquad d(m)f(Mg_{in}(k-m))Q_{in}(k-m)] \end{cases}$$

Here, $f(\bullet)$ denotes a nonlinear function for correcting the nonlinearity of the radio frequency channel, i.e. an inverse function of the nonlinearity characteristic of the radio frequency channel. This function may be selected based upon the characteristics of the power amplifier 150, the system-required characteristics of a radio frequency output signal and the calculation capability supported by the system. The M in the above equations denotes a time constant of a power amplifier memory effect which may be corrected by the pre-distorter 120. The larger the M, the more precise but the more complex the calculation in the pre-distorter would be. The corresponding parameters have to be selected reasonably to represent the compromise between the system requirements and the cost. The inverse nonlinear function $f(\bullet)$ of the radio frequency channel may be expanded by using various base functions, for example, a power function, a Legendre function, etc.

In the case of a power function, this nonlinear function may be expressed by $$f(x) = \sum_{n=0}^{N-1} a_n x^{n\alpha}$$

Here, $a_n$ denotes an expansion coefficient, and $\alpha$ denotes the lowest order of the power function, and may be selected as an integer or fraction. The smaller the $\alpha$, the larger an order N of the base function is, the more precise the pre-distortion model is, the higher the algorithm performance is, but the more complex the calculation would be. Thus, the corresponding parameters have to be selected reasonably to represent the compromise between the system requirements and cost.

In the case of a Legendre function, this nonlinear function may be expressed by $$f(x) = \sum_{n=0}^{N-1} a_n P_n(x)$$

Here, $P_n(x)$ denotes an n-order Legendre function, $a_n$ denotes an expansion coefficient, and N is the number of items in the expanded polynomial. Similarly, the larger the N, the more precise the pre-distortion model is, the higher the algorithm performance is, but the more complex the calculation would be.

As can be seen from the above, each of the I, Q signals output from the pre-distorter 120 in the embodiment of the present invention may be regarded as a sum of outputs of two Finite Impulse Response (FIR) filters which respectively filter the input I, Q signals. Different from the conventional FIR filter, however, coefficients of these filters depend upon the amplitude of an input signal, and this dependency may be expressed by function $f(\cdot)$. The function $f(\cdot)$ may be searched for in a lookup table in accordance with the amplitude of an input signal, for example, for $Mg_{in}(n)$, a corresponding $f(Mg_{in}(n))$ may be found.

Figure 2:
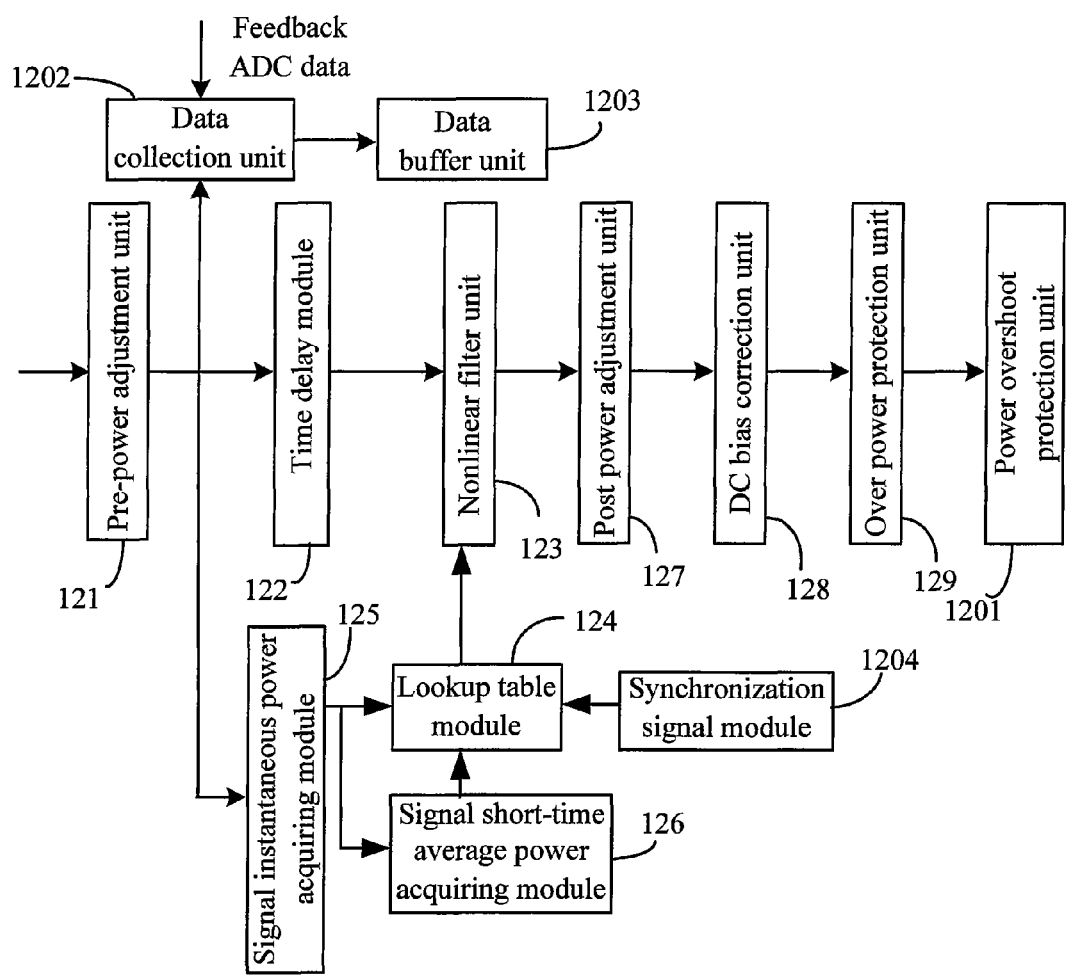
FIG. 2 is a structural diagram of a pre-distorter in the device shown in FIG. 1.

As shown in FIG. 2, the pre-distorter 120 according to an embodiment of the present invention includes the following modules:

1. a pre-power adjustment unit 121: this unit is adapted to adjust the power of a signal output from a base-band modem 110, and send the adjusted signal to a time delay module 122. The pre-power adjustment unit 121 is designed to prevent the input signal from being saturated after passing the pre-distorter 120, and may be implemented with a simple scalar multiplier.

2. a time delay module 122: this module is adapted to delay the data stream of a signal, so as to ensure the coefficients of an FIR lookup table used for FIR calculation to match the samples used by a signal instantaneous power acquiring module 125 and a signal short-time average power acquiring module 126 for calculating the index of the lookup table, and send the delayed signal to a nonlinear filter unit 123.

Figure 3:
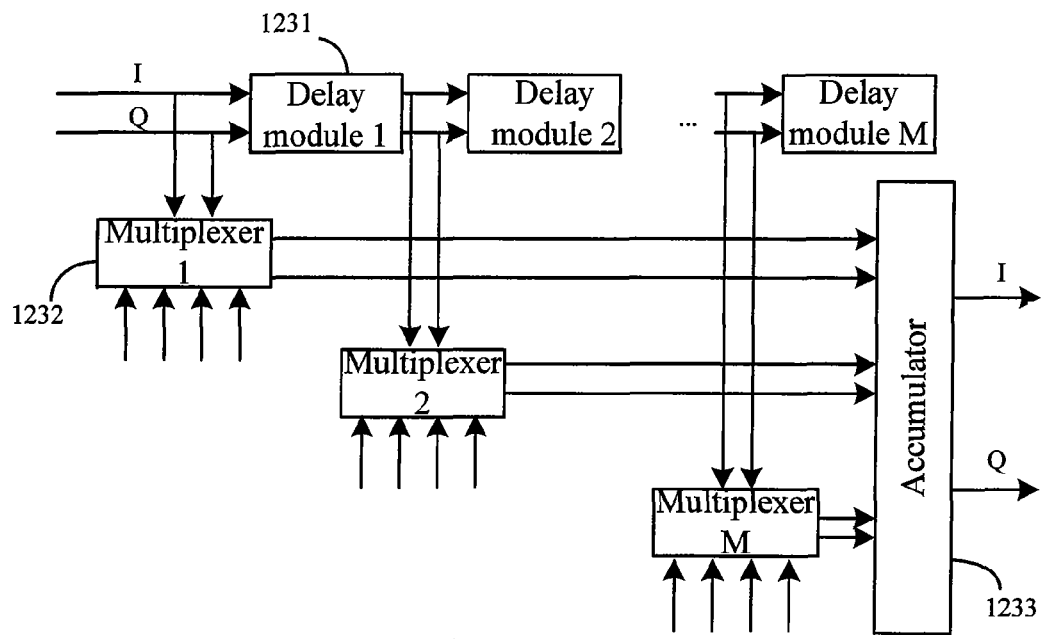
FIG. 3 is a structural diagram of a nonlinear filter unit in the pre-distorter shown in FIG. 2.

3. a nonlinear filter unit 123: this unit is a core part in the pre-distorter 120. As shown in FIG. 3, the nonlinear filter unit 123 is implemented as an M-tap FIR filter with variable coefficients, includes delay modules 1231, multiplier modules 1232 and an accumulator module 1233.

Each of the delay modules 1231 is adapted to delay the data streams of I, Q components of an input signal, and send the delayed input signal to a corresponding multiplier module 1232.

Each of the multiplier modules 1232 is adapted to complex multiplying the input signals respectively in accordance with the received and delayed I, Q components of the input signals as well as the corresponding four nonlinear filter parameters, and output the multiplied signals to the accumulator module 1233.

Each of the multiplier modules 1232 is provided with two I and Q signal inputs, four filter parameter inputs, and two I and Q signal outputs, and may correct the different delays of the I, Q analog signals resulted from transmission effectively. Assume that the I, Q signals input into one of the multiplier modules 1232 are denoted by $I_i$ and $Q_i$, and the four input filter parameters are denoted by $T_{ii}$, $T_{iq}$, $T_{qi}$ and $T_{qq}$, then the output I, Q signals $O_i$ and $Q_q$ may be denoted by $$O_i = I_i \times T_{ii} + Q_i \times T_{iq}$$

$$O_q = I_i \times T_{qi} + Q_i \times T_{qq}$$

The four filter parameters $T_{ii}$, $T_{iq}$, $T_{qi}$ and $T_{qq}$ correspond to the four parameters a, b, c and d contained in the equation showing the relationship of an output complex signal and an input complex signal of the pre-distorter 120, respectively. The parameters T may be determined according to the instantaneous power and the short-time average power of the signals and a synchronization signal, and may be found through searching in a lookup table module 124 in the pre-distorter 120.

The accumulator module 1233 is adapted to accumulate the received signals output from the multiplier modules 1232, and output the accumulated signals to a post power adjustment unit 127.

4. a lookup table module 124: this module is adapted to store and update the nonlinear filter parameters calculated by the adaptive parameter calculation unit 190, select nonlinear filter parameters according to the received statistic results of instantaneous power and short-time average power of an input signal as well as the order number of taps of the nonlinear filter unit 123, and send the selected nonlinear filter parameters to the nonlinear filter unit 123.

Various nonlinear filter parameters and various nonlinear inverse functions $f(\cdot)$ are stored in the lookup table module 124. The lookup table is of three dimensions determined by instantaneous power, short-time average power of a signal and an order number of taps respectively. A nonlinear inverse function $f(\cdot)$ defines a nonlinear relationship between the instantaneous power of an signal, and an output signal. The short-time average power defines an operation point and a temperature of the power amplifier 150, while different short-time average powers correspond to different characteristics of the power amplifier 150. Consequently, different nonlinear inverse functions shall be selected for different short-time average powers. The taps define the correction characteristics of a memory effect of the radio frequency channel. Different nonlinear inverse functions shall be selected according to different taps.

The nonlinear filter parameters stored in the lookup table need to be updated in accordance with the calculation result of the adaptive parameter calculation unit 190. When updating the nonlinear filter parameters stored in the lookup table, only one set of parameters therein may be updated at one time. This set of nonlinear parameters may be in use during the updating, while the power of the signal output from the transmitter shall remain substantially stable during a period of time. Therefore, in order to ensure a good quality of the signal output from the transmitter during the updating of the lookup table, a redundant dynamic switching method may be used for the updating of the parameters in the lookup table according to an embodiment of the present invention. The basic principle of this method will be described below.

Figure 4:
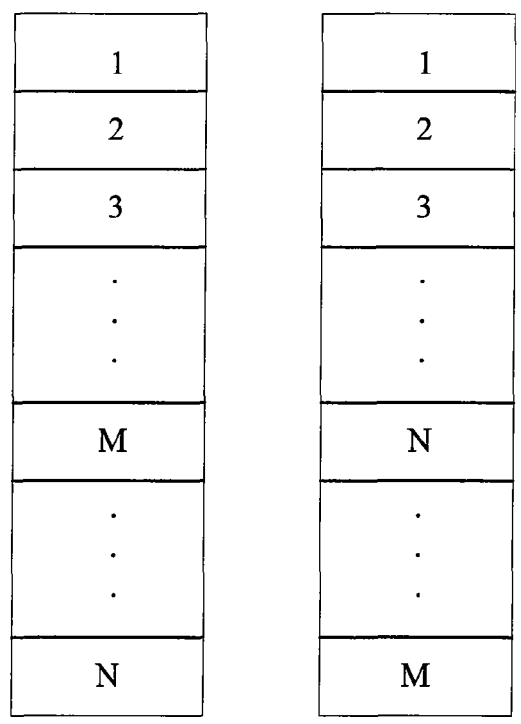
FIG. 4 is a schematic diagram of a lookup table switching policy in the pre-distorter shown in FIG. 2.

If N sets of nonlinear filter parameters are needed to ensure a stable quality of the signal output from the system, N+1 sets of nonlinear filter parameters may be provided in the pre-distorter 120, respectively indexed with 0, 1, 2, . . . N, where the $0^{th}$, $1^{st}$, $2^{nd}$, . . . , $(N-1)^{th}$ sets of nonlinear filter parameters are used for the practical application, and the $N^{th}$ set is used as a switching buffer, which is allocated dynamically in use. If the set of nonlinear filter parameters indexed with M need to be switched in an example, the memory states of the lookup table before and after the switching are as shown in FIG. 4.

Before the switching, the pre-distorter 120 utilizes the sets of nonlinear filter parameters indexed with 0, 1, 2, ..., N−1, while the set of nonlinear filter parameters indexed with N is used for switching. If the set of nonlinear filter parameters indexed with M need to be switched in the example, the adaptive parameter calculation unit 190 firstly writes a new set of filter parameters into the set of nonlinear filter parameters currently indexed with N via an interface provided by the pre-distorter 120. At this time, the original set of nonlinear filter parameters indexed with M are in use, thus the adaptive parameter calculation unit 190 notifies, via an interface, the pre-distorter 120 that the index number of the set of nonlinear filter parameters which need to be switched is M. Then the pre-distorter 120 changes the index number of the set of nonlinear filter parameters, which were originally indexed with M, into N, and changes the index number of the set of nonlinear filter parameters, which were originally indexed with N, into M. The new set of nonlinear filter parameters indexed with M will be used in the subsequent real-time data processing.

This redundant dynamic switching method may effectively prevent the nonlinear filter parameters being in use from being changed dynamically, thereby ensuring a stable quality of the output signal.

Furthermore, in practical implementation, it generally takes a certain period of time to carry out a statistic of the short-time average power of a signal. During this period of time, only one set of nonlinear parameters may be in use. At this time, the addressing for other sets of parameters may be disabled, thus the powering current for these inactive signals may be reduced, so as to achieve a lower power consumption.

5. a signal instantaneous power acquiring module 125: this module is adapted to acquire the instantaneous power of a signal by first calculating the squared sum of I, Q components and then calculating square root of the squared sum, and send the calculation result to the lookup table module 124 so as to select filter parameters.

6. a short-time average power acquiring module 126: this module is adapted to acquire the short-time average power of a signal by calculating the average value of the instantaneous powers of adjacent N points of the signal, and send the calculation result to the lookup table module 124 so as to select filter parameters.

7. a post power adjustment unit 127: this unit is adapted to adjust the power of a signal output from the pre-distorter 120, and send the adjusted signal to a direct-current bias correction unit 128. The post power adjustment unit 127 is provided to ensure that the power of a signal output from the power amplifier satisfies the design requirement. The post power adjustment unit 127 may be implemented by a simple multiplier. The post power adjustment unit 127 may achieve the function of stabilizing the power of the transmitter, by cooperating with a numerically controlled radio frequency attenuator.

8. a direct-current bias correction unit 128: this unit is adapted to adjust the direct-current bias of an output digital signal, and send the adjusted signal to an over power protection unit 129.

9. an over power protection unit 129: this unit is adapted to detect the average power of an output digital signal, and limit the amplitude of the output signal if the average power is greater than a threshold so as to prevent the calculation error of the method and thus protect the power amplifier. The output signal of the over power protection unit 129 is sent to a power overshoot protection unit 1201.

10. a power overshoot protection unit 1201: this unit is adapted to detect the instantaneous power of an output digital signal, and determine the occurrence of power overshoot if a proportion of the instantaneous power greater than the threshold is greater than a predefined proportion. In the case of power overshoot, the system may directly cause the pre-distorter 120 to stop outputting signal, so as to prevent the power amplifier from being burnt down. After the power overshoot disappear, the output of the pre-distorter 120 will be recovered quickly, so as to ensure the normal communication on the link. The pre-distorter 120 outputs the signal via the power overshoot protection unit 1201.

11. a data capture unit 1202: this unit is adapted to sample a certain length of continuous base-band I, Q signals as well as a feedback ADC signal, and send the sampled signals to a data buffer unit 1203.

12. a data buffer unit 1203: this unit is adapted to store the base-band I, Q signals and the feedback ADC signal sampled by the data capture unit 1202. The signals stored in the buffer unit 1203 are sent to the adaptive parameter calculation unit 190 via an interface between the pre-distorter 120 and the adaptive parameter calculation unit 190, so that the adaptive parameter calculation unit 190 may calculate and update the filter parameters in the lookup table.

13. a synchronization signal module 1204: this module is adapted to control the selection of the filter parameters in the lookup table, and control the selection of the sampled signals by the data capture unit in the case of a base-band signal abnormity.

A synchronization signal may be sent in a base-band data stream to the pre-distorter 120 through a hardware connection, or may be directly acquired from the base-band I, Q data stream through a simple detection mechanism inside the pre-distorter 120 if it is easy to detect a signal abnormity.

In the 3G system or the like, in order to locate a user, a base station transmitter may sometimes switch off or reduce the signal output for a while to reserve certain timeslots for the user for location calculation. Alternatively, during data communication, the base station transmitter may periodically transmits a large pilot signal when there is no access of a user, and reduce the transmission power or switch off the signal when there is still no access of a user. Each of these abrupt changes of the signal power may be considered as a power abnormity. In these cases, the synchronization signal of the power signal is needed for special processing.

Figure 5:
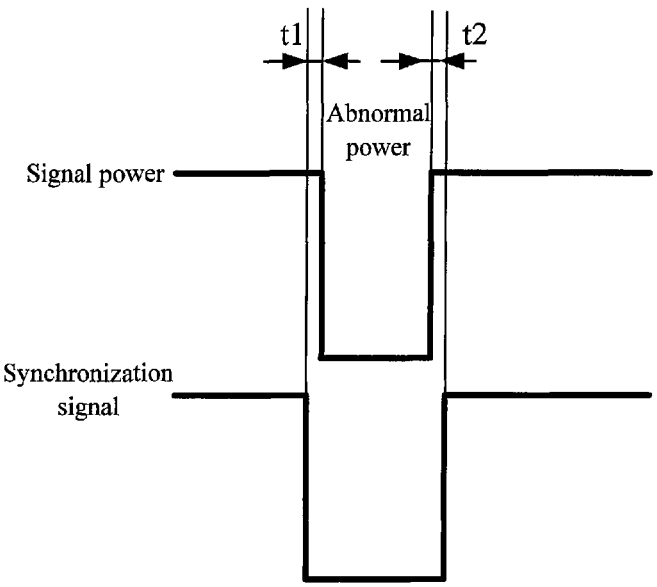
FIG. 5 illustrates a timing relationship between a power abnormity signal and a synchronization signal of a base station transmitter according to an embodiment of the present invention.

The timing relationship between a power abnormity signal and a synchronization signal is as shown in FIG. 5.

Because the base station transmitter presents an apparent nonlinearity in the case of a large signal, the base station transmitter takes the high-power portion of the signal as a normal signal power and takes the low-power portion as an abnormal signal power. It is necessary for the active portion (i.e., the low-level portion) of the synchronization signal to include all the moments at which the signal power is reduced abnormally, so as to achieve effective signal synchronization. In other words, t1 and t2 as shown in FIG. 5 are both larger than zero (where t1 is the time difference between the falling edge of the synchronization signal and occurrence of a signal power abnormity, and t2 is the time difference between the recovery moment from the signal power abnormity and a rising edge of the synchronization signal). The synchronization signal enters a low-level (active) state prior to the occurrence of the power abnormity, and enters a high-level (inactive) state after the recovery from the power abnormity. Unfortunately, this timing may be difficult to implement in the system, because it is impossible to predict an abnormity of the signal power. For the purpose of implementing the timing, the falling edge of the synchronization signal may be allowed to lag slightly behind the falling edge of the signal power, but it should be ensured that the synchronization signal appears in a low level before the detection mechanism of short-time average power in the pre-distorter 120 calculates that a short-time power decision switching occurs. Also, for the purpose of preventing any influence on the pre-distorter 120 in the processing of a normal signal, the durations of t1 and t2 should be selected reasonably depending on the system requirement, and should not be over long. Preferably, the durations of t1 and t2 may be $-3\,\mu s < t1 < 10\,\mu s$, and $0 < t2 < 10\,\mu s$.

The synchronization signal may have an influence on the function of short-time average power calculation and decision and the function of signal sampling in the pre-distorter 120. Therefore, if the synchronization signal is in a low-level (i.e., active), the calculation of the short-time average power should be stopped, while the originally calculated value is kept unchanged. The calculation of the short-time average power should not be recovered until the synchronization signal enters a high level. Also, in the case of the synchronization signal in an active low-level, the data capture unit of the pre-distorter 120 should stop the sampling of the base-band and feedback data, and the sampling should not be recovered until the synchronization signal enters a high level.

Figure 6:
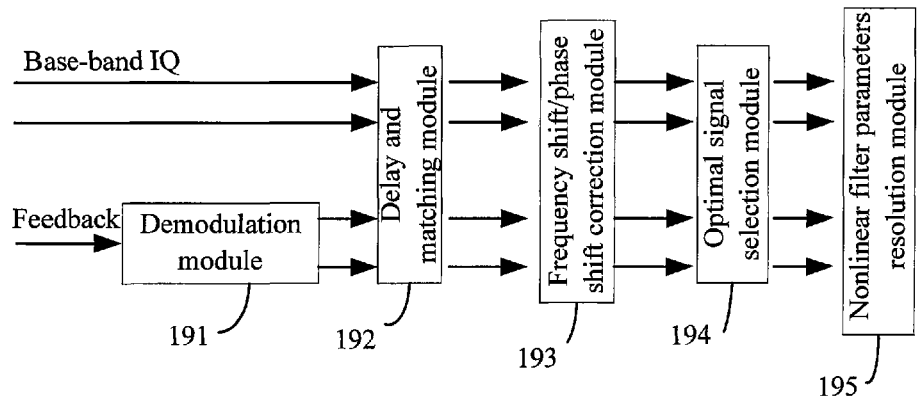
FIG. 6 shows a flow chart of calculating a nonlinear filter parameter in an adaptive parameter calculation unit in the device shown in FIG. 2.

The adaptive parameter calculation unit 190 in the device according to the embodiment of is adapted to calculate nonlinear filter parameters, with a structure as shown in FIG. 6. The adaptive parameter calculation unit 190 includes the following modules.

A Demodulation module 191: this module is adapted to demodulate a feedback digital intermediate-frequency signal.

The demodulation is to recover the feedback I, Q signals from the feedback digital intermediate-frequency signal. In particular, the demodulation may be implemented by the following method: First, two orthogonal components (i.e. a sine component and a cosine component) of the carrier of the intermediate-frequency signal are recovered in the adaptive parameter calculation unit 190 because the feedback intermediate-frequency points are known during the design of the system. Then the sampled intermediate-frequency signal is multiplied with the cosine component of the carrier, and the multiplied signal is low-pass filtered, thus the feedback I signal is obtained. The feedback Q signal may be obtained by multiplying the sampled intermediate-frequency signal with the sine component of the carrier and low-pass filtering the multiplied signal.

A delay and matching module 192: this module is adapted to delay and match the base-band I, Q signals with the feedback I, Q signals.

The delay and matching is to align the base-band I, Q signals with the feedback I, Q signals in time by using a correlation algorithm. In the correlation algorithm, the cross-correlation function between the base-band I, Q signals and the feedback I, Q signals is calculated, the location where a peak occurs is acquired, the index number of the location corresponds to the delay value of the feedback signals relative to the base signals. Then the redundant portions of the base-band and feedback signals are removed according to the calculated delay value, so as to obtain the delayed and matched base band I, Q signals and feedback I, Q signals.

A frequency shift/phase shift correction module 193: this module is adapted to correct the frequency shift and the phase shift between the base-band signals and the feedback signals.

A frequency shift and a phase shift may exist between the base-band signals and the feedback signals. The frequency shift and a phase shift between the base-band signals and the feedback signals should be corrected, so as to calculate a pre-distortion function properly. This correction may be done by the following method: first, the phase difference between the base-band signals and the feedback signals is calculated; the accurate values of the frequency shift and the phase shift may be obtained by using the least square algorithm, because the frequency shift and phase shift correspond to the slope and the intercept of the phase difference-time linear function respectively. Then, feedback I, Q signals with neither frequency shift nor phase shift may be obtained by removing the accurate values of the frequency shift and the phase shift directly from the feedback signals.

An optimal signal selection module 194: this module is adapted to select optimal data from the base-band signals and the feedback signals.

The procedure of calculating the nonlinear filter parameters in the adaptive parameter calculation unit 190 is very complex, thus the calculation amount will be considerable if all the base-band and feedback I, Q signals are used in the calculation of parameters, which exceeds the processing capability of the digital signal processing chips available in the industry. Therefore, representative data for calculation of nonlinear filter parameters should be selected from the base-band and feedback I, Q signals acquired from sampling, so as to obtain an achievable calculation amount.

With an analysis of the digital signal characteristics of the transmitter and the nonlinearity characteristics of the transmission channel, the embodiments of the present invention present two method for selecting optimal data from the base-band and feedback signals, one is a peak sample selection method, and the other is a random sample selection method.

In the peak sample selection method, it is considered that the power amplifier is the most sensitive to the instantaneous power of a signal in the nonlinear system of the transmission channel. During the selection of an optimal signal, the selection shall be made from signal samples with the following features:

1. Peak amplitude: i.e., a sample having peak signal instantaneous amplitude.
2. Peak IQ value: i.e., a sample having peak absolute value of I or Q signal.
3. Peak variation: i.e., a sample, the two adjacent signal samples of this sample have a peak variation in amplitude or I, Q values.

A particular implementation of the peak sample selection method is as follows: Assume that S is the number of optimal samples for calculation acceptable by the system, then N peak samples are selected from the samples with the above peak values. Each of the selected peak samples is then taken as a center, and S/2N samples are selected respectively on the left and right of each center. As a result, the total number of the selected samples is:

$$\left(\frac{S}{2N} + \frac{S}{2N}\right) \times N = S$$

A desired number of samples may be obtained. If several samples on the left or right of the peaks of the I or Q signal overlap, the overlapping samples shall be used for calculation only once, and the numbers of sample(s) around the overlapping samples are increased respectively so as to ensure a constant total number. Additionally, some random samples may be inserted when appropriate in the peak sample selection method, so that the data may be sufficiently representative of the signals.

Figure 7:
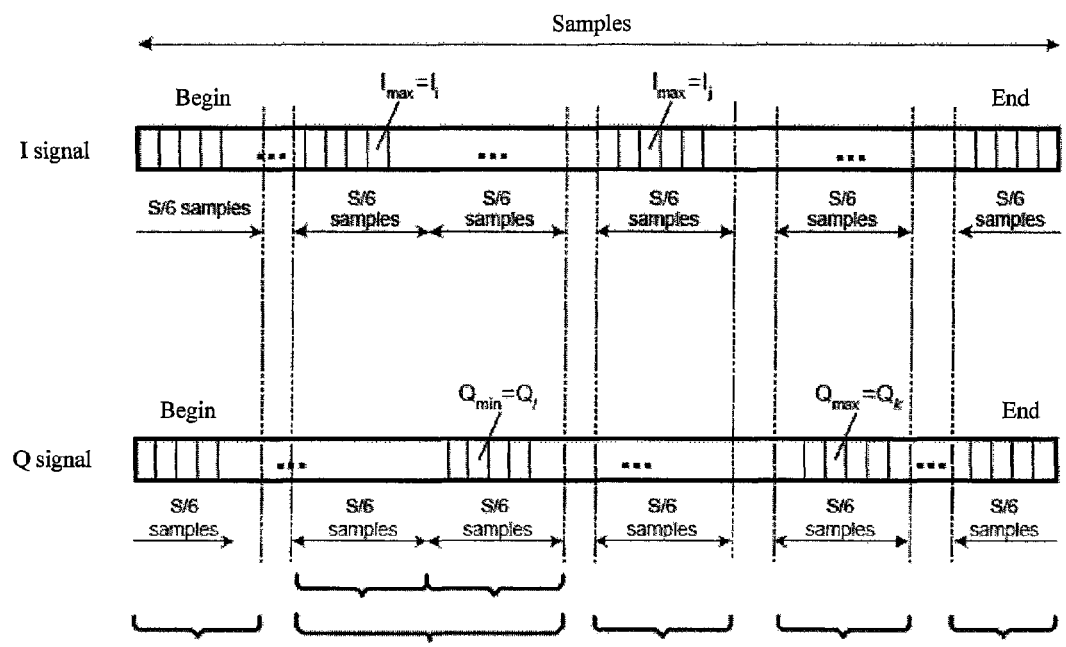
FIG. 7 shows a selection procedure in a method for selecting a peak sample according to an embodiment of the present invention.

A selection procedure in the peak sample selection method according to an embodiment of the present invention is as shown in FIG. 7. Assume that S is the number of optimal samples for calculation, then the signals may be divided into 6 segments in the method. Maximum values and minimum values of I, Q signals are selected in the signal data stream, and there are totally 4 segments, each with a length of S/6. Further S/6 samples are selected at the beginning and end respectively as random filling data. As can be seen from FIG. 7, there is overlapping between the data segments corresponding to the maximum values of I and the minimum values of Q. In this regard, additional samples are selected on the left of the samples selected based upon the maximum values of I, and on the right of the samples selected based upon the maximum values of Q, so that the total number of samples, i.e. S, remains constant.

The principle of the random sample selection method lies in that: samples with different signal amplitudes shall be selected, and preferably, the selected samples may have a distribution characteristic identical with that of amplitudes prior to the selection, so as to model the nonlinear system effectively.

Consequently, a particular implementation of the random sample selection method is as follows: A random seed is selected, and multiplies of this random seed are used in selection of signal samples in the signal. The amplitude range corresponding to the signal is recorded. If data within this range fails to satisfy a predetermined requirement, the data is recorded, otherwise the data is dropped. This above procedure is repeated until sufficient samples are selected.

A nonlinear parameter resolution module 195: this module is adapted to calculate nonlinear filter parameters in accordance with the selected optimal data.

Currently, there are many matured algorithm such as Recursive Least Square (RLS), Least Mean Squares (LMS), QR Recursive Least Square (QR-RLS), etc., which may be used to calculate nonlinear filter parameters in accordance with the selected optimal data according to an embodiment of the present invention.

Based upon the structure of the above described adaptive parameter calculation unit, a method for calculating nonlinear filter parameters is provided according to an embodiment of the present invention. This method includes the procedures of:

1. demodulating a feedback digital signal;
2. delaying and matching the demodulated feedback signal and a base-band signal;
3. calculating the frequency shift and the phase shift between the base-band signal and feedback signal by using the least square algorithm, and correcting the frequency shift and the phase shift of the delayed and matched feedback signal and base-band signal;
4. selecting optimal data from the feedback signal and base-band signal after the frequency shift and phase shift correction by using the peak sample selection method and the random sample selection method;
5. calculating nonlinear filter parameters in accordance with the selected optimal data by using a certain algorithm.

Figure 8:
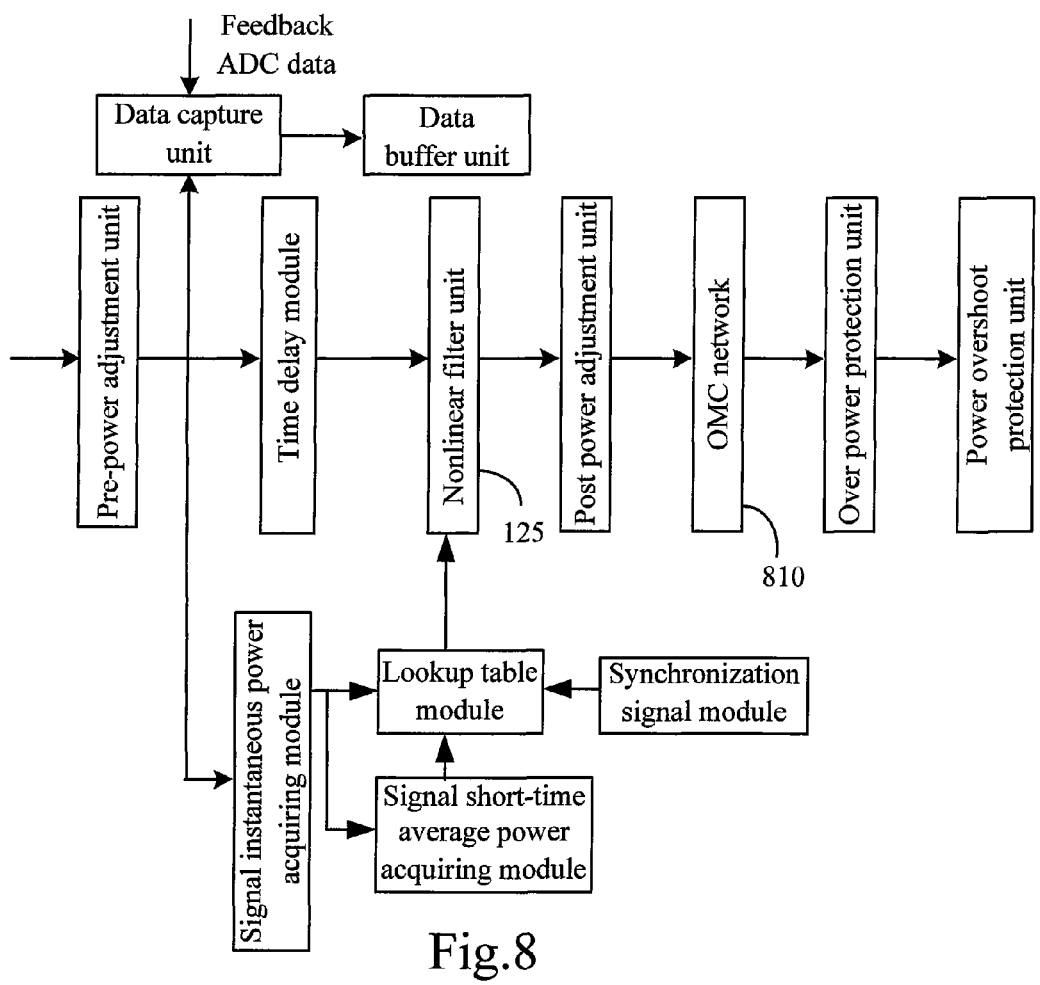
FIG. 8 is a structural diagram of a simplified pre-distorter according to an embodiment of the present invention.

An embodiment of the present invention provides a simplified pre-distorter. The structure of the simplified pre-distorter is as shown in FIG. 8. In comparison with FIG. 2, a Quadrature Modulation Compensation (QMC) network is used instead of the direct-current bias correction unit, and the internal structure of the nonlinear filter unit 125 is also simplified.

Figure 9:
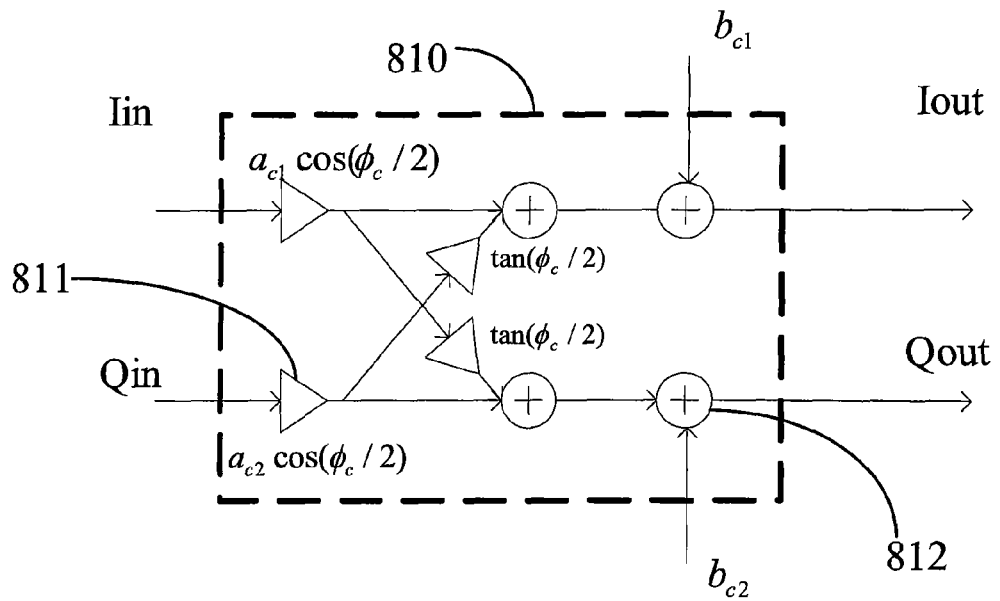
FIG. 9 is a structural diagram of a QMC network in the pre-distorter shown in FIG. 8.

The QMC network 810 is adapted to correct the IQ gain, the phase imbalance and the direct-current bias. As illustrated by the structure shown in FIG. 9, the QMC network 810 includes four multipliers 811 and four adders 812 which perform the calculation operations as shown in FIG. 9. The values of two direct-current bias correction parameters bc1 and bc2 in the QMC network are equivalent to the two direct-current correction parameters of the direct-current corrector as shown in FIG. 2. Gain-imbalance correction parameters ac1 and ac2 and a phase-imbalance correction parameter $\phi c$ may be calculated in accordance with the four parameters a, b, c and d in the above described implementation of the pre-distorter.

In this manner, the number of parameters input into an FIR filter may be reduced from four to two, thus half of the system memories may be saved.

Figure 10:
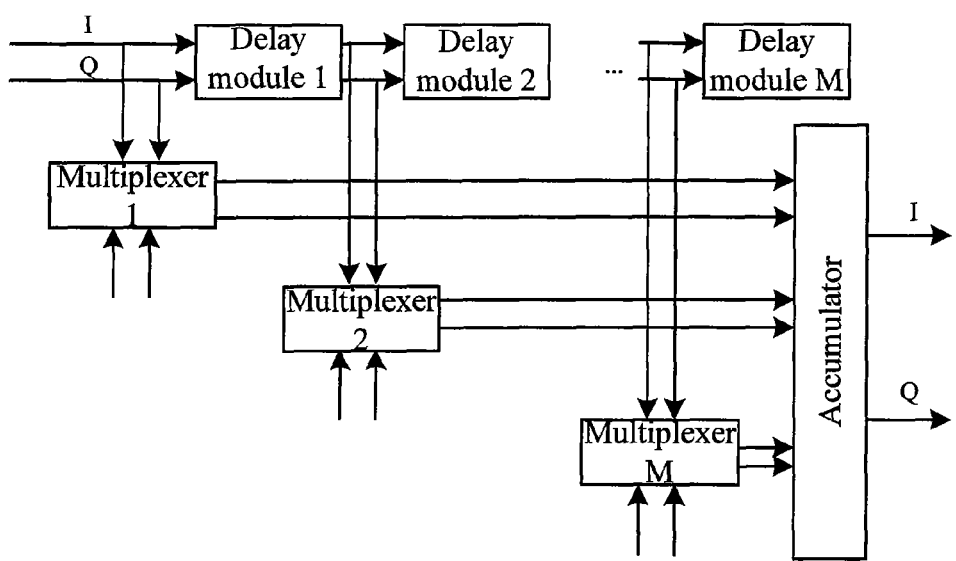
FIG. 10 is a structural diagram of a nonlinear filter unit in the pre-distorter shown in FIG. 8.

In the nonlinear filter unit 125 of the simplified pre-distorter, each of the taps of the filter is provided with two I, Q signal inputs, two filter parameter inputs, and two I, Q signal outputs. The structure of the M-tap nonlinear filter unit 125 is as shown in FIG. 10, where the I, Q input signals and the coefficients of each tap are multiplied as the following equations:

$$O_i = I_i \times T_i - Q_i \times T_q$$

$$O_q = I_i \times T_q + Q_i \times T_i$$

Here, O denotes an output signal, $O_i$ and $O_q$ respectively denote I, Q components of an output signal, $I_i$ and $Q_q$ respectively denote I, Q components of an input signal, and T denotes a filter coefficient. The parameter T may be selected depending upon the instantaneous power and the short-time average power of a signal as well as a synchronization signal, as in the method for parameter selection in the non-simplified pre-distortion FIR filter.

Figure 11:
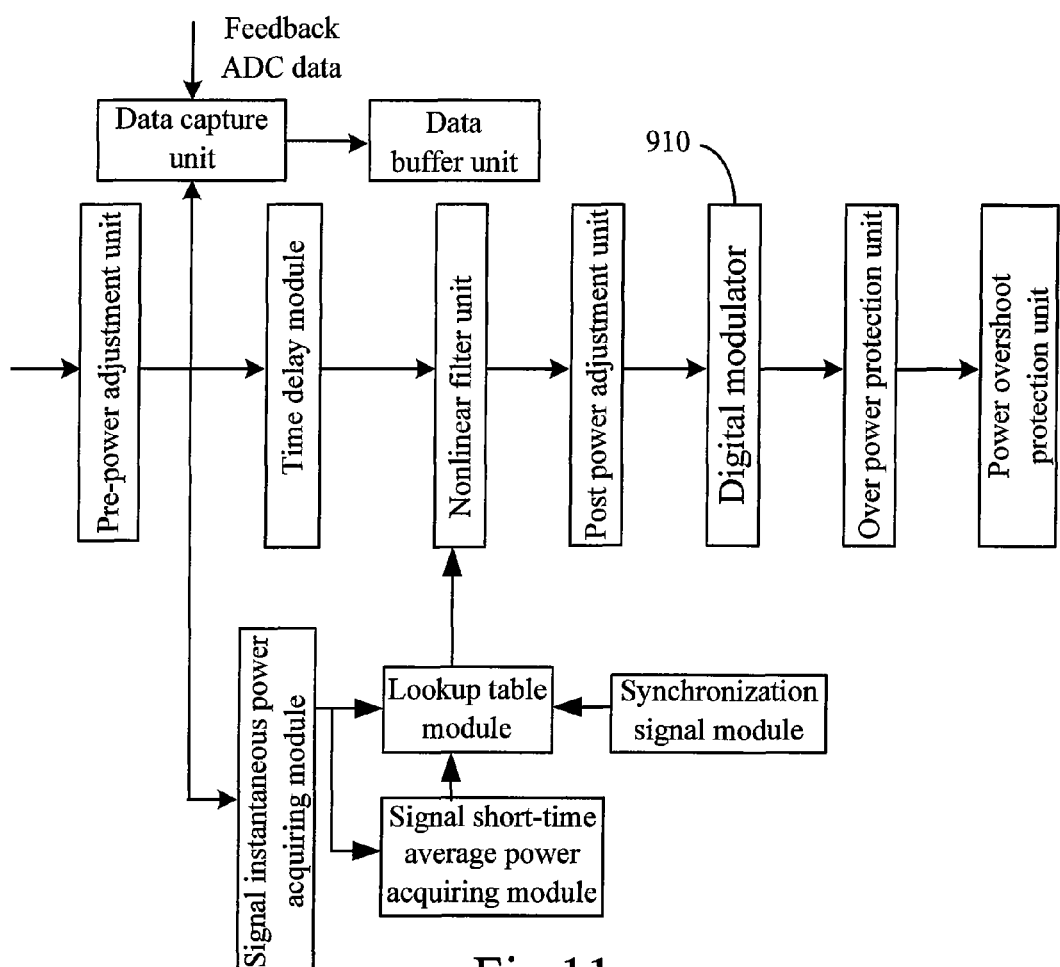
FIG. 11 is a structural diagram of an improved pre-distorter according to an embodiment of the present invention.

In the device according to an embodiment of the present invention, there may be a risk in the use of the IQ demodulator of the device as shown in FIG. 1 to convert a signal from radio frequency into intermediate frequency if the transmitter imposes a strict requirement on local oscillation leakage and the IQ gain and phase imbalance of a signal. In view of this, an embodiment of the present invention provides an improved pre-distorter, which is as shown in FIG. 11.

In the improved pre-distorter, a conventional double frequency conversion technology is adopted. In the double frequency conversion, first the IQ signals are modulated to a digital intermediate frequency in the pre-distorter, then the signals output from the pre-distorter are digital-to-analog converted into digital intermediate-frequency signals, and finally the digital intermediate-frequency signals are converted to radio frequency. In the structure of the improved pre-distorter, a digital modulator 910 is used instead of the QMC network in FIG. 8 and the direct-current bias correction unit in FIG. 2.

Figure 12:
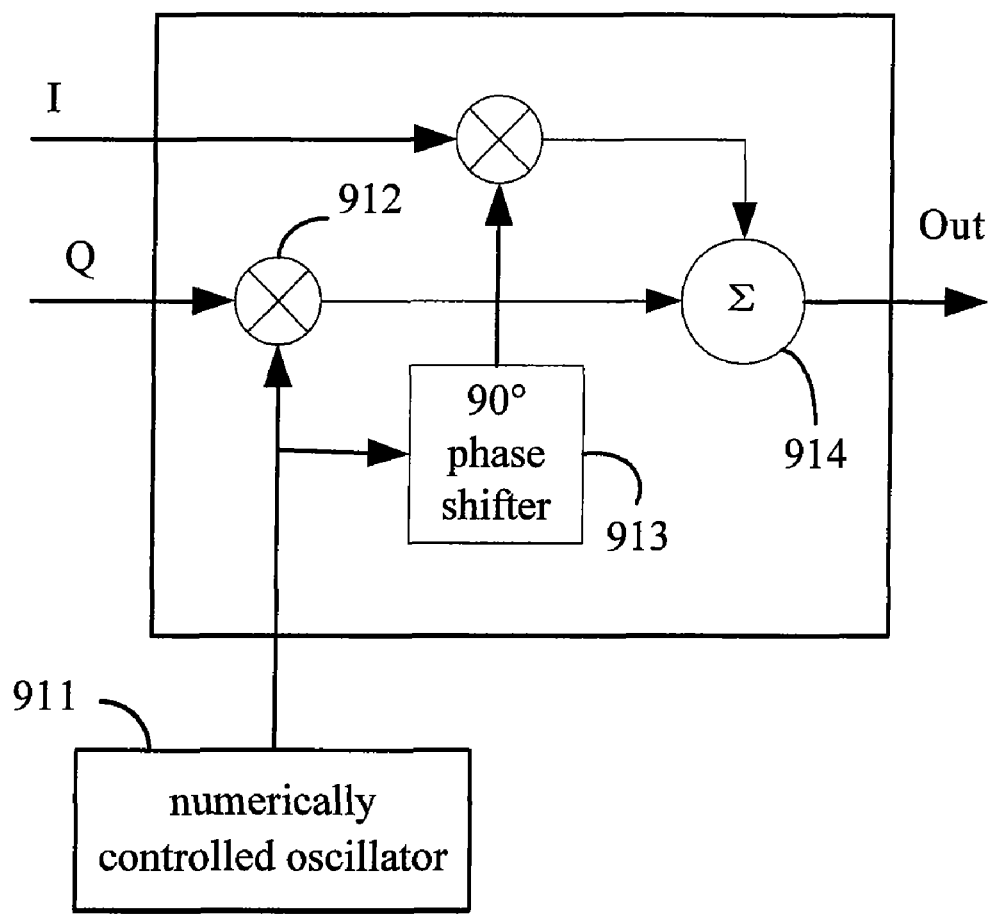
FIG. 12 is a structural diagram of a digital modulator in the pre-distorter shown in FIG. 11.

As illustrated by the structure as shown in FIG. 12, the digital modulator includes five parts, i.e., a Numerically Controller Oscillator (NCO) 911, two multipliers 912, a 90° phase shifter 913 and an adder 914. A particular operation flow of the digital modulator is shown as follows:

In step 12-1, the NCO 911 generates a desired digital intermediate-frequency local oscillation sine signal.

In step 12-2, the 90° phase shifter 913 shifts the phase of the local oscillation sine signal obtained in step 12-1 by 90°, so as to obtain a local oscillation cosine signal.

In step 12-3, the local oscillation sine signal is multiplied with the input I signal, and the local oscillation cosine signal is multiplied with the input Q signal, respectively in the two multipliers 912.

In step 12-4, the two multiplied signals obtained in step 12-3 are added up in the adder 914 so as to obtain an output signal of the digital modulator 910.

Accordingly, a method for pre-distorting a base-band digital signal according to an embodiment of the present invention includes the procedures of:

calculating nonlinear filter parameters in accordance with samples of a received base-band digital signal and samples of a feedback signal of a radio frequency channel;

performing power statistics of the input base-band digital signal, selecting nonlinear filter parameters corresponding to the result of the power statistics, pre-distorting the base-band digital signal, and outputting the pre-distorted base-band digital signal.

In particular, the pre-distorting includes the process of delaying the data stream of the input signal, performing calculation operation for the delayed multi-stage input signals and the corresponding nonlinear filter parameters, and generating and outputting the output signal.

In an embodiment of the present invention, the pre-distorting includes the procedures of:

delaying data streams of the I, Q components of the input signal;

complex multiplying the input signal in accordance with the received and delayed I, Q components of the input signal and the corresponding nonlinear filter parameters, accumulating the multiplied signal, and outputting the multiplied signal.

In the complex multiplying, a relationship between the input signal and the output signal may be expressed by $$O_i = I_i \times T_{ii} + Q_i \times T_{iq}$$

$$O_q = I_i \times T_{qi} + Q_i \times T_{qq}$$

Here, $I_i$ and $Q_i$ respectively denote the I, Q components of the input signal, $T_{ii}$, $T_{iq}$, $T_{qi}$ and $T_{qq}$ respectively denote the received four filter parameters, and $O_i$ and $O_q$ respectively denote the I, Q components of the output signal.

Optionally, in the complex multiplying, a relationship between the input signal and the output signal may be expressed by $$O_i = I_i \times T_i - Q_i \times T_q$$

$$O_q = I_i \times T_q + Q_i \times T_i$$

Here, $I_i$ and $Q_q$ respectively denote the I, Q components of the input signal, $T_i$ and $T_q$ respectively denote the received corresponding two filter parameters, and $O_i$ and $O_q$ respectively denote the I, Q components of the output signal.

The power statistics includes calculating the instantaneous power of the input signal and calculating the short-time average power of the input signal.

The procedure for selecting nonlinear filter parameters includes selecting the nonlinear filter parameters in accordance with the calculation results received from a signal instantaneous power acquiring module and a signal short-time average power acquiring module, as well as the order number of the taps of the nonlinear filter unit.

As discussed previously, the nonlinear filter parameters may be updated redundantly and dynamically according to an embodiment of the present invention.

Furthermore, in the case of an abnormity in the base-band signal, a synchronization signal of the base-band signal may be provided to the pre-distorter, and may be used to control the selection of the nonlinear filter parameters, to control the pre-distorter so that the sampling of the base-band and feedback data may be stopped temporarily in the case of the abnormity in the base-band signal.

The procedure for calculating nonlinear filter parameters includes:

demodulating the feedback digital intermediate-frequency signal into feedback IQ signals; delaying and matching received base-band IQ signals and the feedback IQ signals; correcting the frequency shift and phase shift between the delayed and matched base-band IQ signals and the feedback IQ signals; selecting optimal data from the corrected base-band IQ signals and the feedback IQ signals; and calculating the nonlinear filter parameters in accordance with the selected optimal data.

While the preferred embodiments of the present invention have been described as above, the scope of the present invention shall not be limited to these embodiments. Indeed, modifications or alternatives which may occur to those skilled in the art in light of the disclosure of the present invention shall fall within the scope of the present invention as defined in the accompanying claims.

What is claimed is:

1. A device for pre-distorting a base-band digital signal, comprising an adaptive parameter calculation unit and a pre-distorter, wherein the adaptive parameter calculation unit is configured to calculate nonlinear filter parameters in accordance with samples of a base-band digital signal and samples of a feedback signal of a radio frequency channel, and output a calculation result to the pre-distorter; and the pre-distorter is configured to store and update the nonlinear filter parameters, perform power statistics of the base-band digital signal, select nonlinear filter parameters corresponding to a result of the power statistics, pre-distort the base-band digital signal by using the selected nonlinear filter parameters, and output the pre-distorted base-band digital signal;

wherein the pre-distorter comprises a nonlinear filter unit, and the nonlinear filter unit comprises a delay module, a multiplier module and an accumulator, the delay module is configured to delay data streams of I, Q components of the input signal, and send the delayed I, Q components of the input signal to the multiplier module;

the multiplier module is configured to complex multiply the input signal in accordance with the delayed I, Q components of the input signal and the selected nonlinear filter parameters, and output the multiplied signal to the accumulator; and the accumulator is configured to accumulate the signal output from the multiplier, and output the accumulated signal.

2. The device according to claim 1, wherein nonlinearity characteristics of the pre-distorter are reciprocal to nonlinearity characteristics of the radio frequency channel.

3. The device according to claim 1, wherein, in the multiplier, a relationship between the input signal and the output multiplied signal is expressed by $$O_i = I_i \times T_{ii} + Q_i \times T_{iq}$$

$$O_q = I_i \times T_{qi} + Q_i \times T_{qq}$$

where $I_i$ and $Q_i$ respectively denote the I, Q components of the input signal, $T_{ii}$, $T_{iq}$, $T_{qi}$ and $T_{qq}$ respectively denote four corresponding nonlinear filter parameters, $O_i$ and $Q_q$ respectively denote I, Q components of the output multiplied signal.

4. The device according to claim 1, wherein, in the multiplier, a relationship between the input signal and the output multiplied signal is expressed by $$O_i = I_i \times T_i - Q_i \times T_q$$

$O_q = I_i \times T_q + Q_i \times T_i$ where $I_i$ and $Q_q$ respectively denote the I, Q components of the input signal, $T_i$ and $T_q$ respectively denote two corresponding nonlinear filter parameters, and $O_i$ and $O_q$ respectively denote I, Q components of the output multiplied signal.

5. The device according to claim 3, wherein the pre-distorter further comprises a signal instantaneous power acquiring module, a signal short-time average power acquiring module and a lookup table module, the signal instantaneous power acquiring module is configured to calculate instantaneous power of an input signal, and send a calculation result to the lookup table module;

the signal short-time average power acquiring module is configured to calculate short-time average power of an input signal, and send a calculation result to the lookup table module; and the lookup table is configured to store and update the nonlinear filter parameters calculated by the adaptive parameter calculation unit, select nonlinear filter parameters in accordance with the calculation results received from the signal instantaneous power acquiring module and the signal short-time average power acquiring module as well as an order number of taps of the nonlinear filter unit, and output the selected nonlinear filter parameters to the nonlinear filter unit.

6. The device according to claim 5, wherein the lookup table module comprises:

a buffer memory for switching the nonlinear filter parameters, which is configured to update the nonlinear filter parameters dynamically.

7. The device according to claim 5, wherein the pre-distorter further comprises:

a pre-power adjustment and delay unit, configured to adjust power of the base-band digital signal, delay data stream of the adjusted signal, and send the delayed data stream to the nonlinear filter unit;

a signal sampling and buffer module, configured to sample the base-band digital signal and the feedback signal of an output signal of the radio frequency channel, and buffer and send the sampled signals to the adaptive parameter calculation unit;

a post power adjustment unit, configured to adjust power of an output signal of the pre-distorter, and send the adjusted output signal; and a signal adjustment module, configured to adjust phase of the output signal from the post power adjustment unit, and output the adjusted output signal.

8. The device according to claim 7, wherein the signal adjustment module comprises:

a direct-current bias correction unit, configured to adjust direct-current bias of a digital signal, and send the corrected signal; or a Quadrature Modulation Compensation network, configured to correct IQ gain, phase imbalance and direct-current bias of a digital signal, and output the corrected signal; or a digital modulator, configured to modulate digital IQ signals onto a digital intermediate frequency, and output the modulated signals.

9. The device according to claim 8, wherein the pre-distorter further comprises:

an over power protection unit, configured to detect average power of an output signal of the pre-distorter, and limit amplitude of an output signal with an average power greater than a threshold of the pre-distorter; and a power overshoot protection unit, configured to detect instantaneous power of an output signal of the pre-distorter, switch off the output signal of the pre-distorter if a proportion of the instantaneous power of the output signal greater than the threshold is greater than a predefined proportion, and recover the output signal of the pre-distorter after the instantaneous power of the output signal becomes normal.

10. The device according to claim 9, wherein the pre-distorter further comprises:

a synchronization signal module, configured to provide the pre-distorter with a synchronization signal of the base-band digital signal if a abnormity appears in the base-band digital signal, control the selection of nonlinear filter parameters in the lookup table module by using the synchronization signal, and control the pre-distorter to stop sampling the base-band digital signal and the feedback signal if an abnormity appears in the base-band digital signal.

11. The device according to claim 10, wherein the synchronization signal provided by the synchronization signal module enters a low-level state prior to occurrence of a power abnormity of the base-band digital signal, and enters a high-level state after the base-band digital signal recovers from the power abnormity.

12. The device according to claim 1, wherein the adaptive parameter calculation unit comprises:

a demodulation module, configured to demodulate a feedback digital intermediate-frequency signal so as to obtain feedback IQ signals;

a delay and matching module, configured to delay and match received base-band IQ signals and the feedback IQ signals;

a frequency shift/phase shift correction module, configured to correct frequency shift and phase shift between the delayed and matched base-band IQ signals and feedback IQ signals;

an optimal signal selection module, configured to select optimal data from the corrected base-band IQ signals and feedback IQ signals; and a nonlinear parameter resolution module, configured to calculate nonlinear filter parameters in accordance with the optimal data by using a certain algorithm.

13. The device according to claim 12, further comprising:

a signal conversion and modulation module, configured to convert a pre-distorted digital signal into an analog signal, and modulate and convert the analog signal to a radio frequency;

a radio frequency channel, comprising a power amplifier, configured to amplify power of the analog signal converted to the radio frequency, and output the amplified signal; and a signal feedback and sampling module, configured to feed back and sample the signal output from the radio frequency channel, and send the sampled signal to the pre-distorter.

14. A method for calculating nonlinear filter parameters, comprising:

demodulating a feedback digital signal;

delaying and matching the demodulated feedback digital signal and a base-band digital signal;

correcting frequency shift and phase shift of the delayed and matched feedback digital signal and base-band digital signal;

selecting optimal data from the base-band digital signal and the feedback digital signal obtained by correcting the frequency shift and phase shift; and calculating nonlinear filter parameters in accordance with the selected optimal data.

15. The method for calculating nonlinear filter parameters according to claim 14, wherein prior to correcting frequency shift and phase shift of the delayed and matched feedback digital signal and base-band digital signal, the method further comprises:

obtaining the frequency shift and phase shift between the base-band digital signal and the feedback digital signal by using a least square algorithm.

16. The method for calculating nonlinear filter parameters according to claim 14, wherein selecting optimal data from the base-band digital signal and the feedback digital signal obtained by correcting the frequency shift and phase shift comprises:

selecting optimal data from the base-band digital signal and the feedback digital signal by using a peak sample selection method and/or a random sample selection method, wherein the peak sample selection method selects sufficient samples having one of maximum signal instantaneous amplitude, or maximum signal absolute value, or maximum signal amplitude variance; and the random sample selection method selects sufficient samples having distribution characteristic identical to amplitude distribution characteristic of a signal to be selected.

17. A method for pre-distorting a base-band digital signal, comprising:

calculating, by an adaptive parameter calculation unit, nonlinear filter parameters in accordance with samples of an input base-band digital signal and samples of a feedback signal of a radio frequency channel; and performing, by a pre-distorter, power statistics of the input base-band digital signal, selecting nonlinear filter parameters corresponding to a result of the power statistics, pre-distorting the input base-band digital signal by using the selected nonlinear filter parameters, and outputting the pre-distorted base-band digital signal;

wherein the pre-distorting the input base-band digital signal comprises:

delaying data streams of I, Q components of the input base-band digital signal; and complex multiplying the input base-band digital signal in accordance with the delayed IQ components of the input base-band digital signal and the selected nonlinear filter parameters, accumulating signals obtains from the complex multiplying, and outputting the accumulated signal.

18. The method according to claim 17, wherein in the complex multiplying, a relationship between the input base-band digital signal and the output signal is expressed by $$O_i = I_i \times T_{ii} + Q_i \times T_{iq}$$

$$O_q = I_i \times T_{qi} + Q_i \times T_{qq}$$

wherein $I_i$ and $Q_i$ respectively denote the I, Q components of the input base-band digital signal, $T_{ii}$, $T_{iq}$, $T_{qi}$ and $T_{qq}$ respectively denote four selected nonlinear filter parameters, $O_i$ and $Q_q$ respectively denote I, Q components of the output signal.

19. The method according to claim 17, wherein in the complex multiplying, a relationship between the input signal and the output signal is expressed by $$O_i = I_i \times T_i - Q_i \times T_q$$

$$O_q = I_i \times T_q + Q_i \times T_i$$

wherein $I_i$ and $Q_q$ respectively denote I, Q components of the input base-band digital signal, $T_i$ and $T_q$ respectively denote two selected nonlinear filter parameters, and $O_i$ and $O_q$ respectively denote I, Q components of the output signal.

20. The method according to claim 18, wherein performing power statistics of the input base-band digital signal comprise: calculating instantaneous power of the input base-band digital signal; and calculating short-time average power of the input base-band digital signal;

selecting nonlinear filter parameters comprises: selecting nonlinear filter parameters in accordance with calculation results received from a signal instantaneous power acquiring module and a signal short-time average power acquiring module as well as an order number of taps of a nonlinear filter unit.

21. The method according to claim 17, further comprising:

updating the nonlinear filter parameters redundantly and dynamically.

* * * * *